United States Patent [19]

Matsuda

[11] Patent Number: 5,619,145
[45] Date of Patent: Apr. 8, 1997

[54] PROBE APPARATUS AND METHOD FOR INSPECTING OBJECT USING THE PROBE APPARATUS

[75] Inventor: Kaoru Matsuda, Osaka, Japan

[73] Assignee: Tokyo Electron Limited, Japan

[21] Appl. No.: 587,341

[22] Filed: Jan. 16, 1996

Related U.S. Application Data

[63] Continuation of Ser. No. 260,012, Jun. 15, 1994, abandoned.

[30] Foreign Application Priority Data

Jun. 19, 1993 [JP] Japan .................................. 5-172747

[51] Int. Cl.$^6$ .................................................. G01R 31/06
[52] U.S. Cl. .......................................... 324/754; 324/765
[58] Field of Search .............................. 324/158.1, 73.1, 324/755, 758, 765; 414/222, 417, 422, 786; 269/21, 60; 901/40, 48; 209/573, 570; 198/574; 437/8; 257/40, 48

[56] References Cited

U.S. PATENT DOCUMENTS

| | | | |
|---|---|---|---|
| 4,103,232 | 7/1978 | Sugita et al. | 324/754 |
| 4,485,911 | 12/1984 | Cameron | 198/345 |
| 4,786,867 | 11/1988 | Yamatsu | 324/758 |
| 4,787,800 | 11/1988 | Sone et al. | 414/222 |
| 4,938,654 | 7/1990 | Schram | 414/752 |
| 5,105,147 | 4/1992 | Karasikov et al. | 324/537 |
| 5,148,100 | 9/1992 | Sekiba | 324/765 |
| 5,172,053 | 12/1992 | Itoyama | 324/758 |
| 5,374,888 | 12/1994 | Karasawa | 324/765 |
| 5,420,520 | 5/1995 | Anschel et al. | 324/754 |
| 5,479,108 | 12/1995 | Cheng | 324/765 |

FOREIGN PATENT DOCUMENTS 2-66474  3/1990  Japan .
5-67652  3/1993  Japan .

OTHER PUBLICATIONS

Application Number 07/937,790 Inventor(s) Karasawa Filing Date Sep. 2, 1992.

*Primary Examiner*—Vinh P. Nguyen
*Attorney, Agent, or Firm*—Graham & James LLP

[57] ABSTRACT

A probe apparatus including a plurality of object accommodating members each having a plurality of object accommodating portions for receiving objects to be inspected, each of the object accommodating portions having suction holes formed in an inner bottom surface thereof and used to suck the object, a cassette for containing the object accommodating members, a table on which each of the object accommodating members is to be placed, the table being movable in X, Y and Z directions and rotatable in a θ direction, a transfer unit for transferring each of the object accommodating members between the table and the cassette, and a detecting section having a plurality of probe needles, for electrically inspecting objects one by one which are accommodated in the accommodating member placed on the table. Further, a method for inspecting objects, including the steps of transferring from a cassette onto a table located in a detecting section, an object accommodating member which is contained in the cassette with a plurality of objects mounted thereon, and has object accommodating portions and suction holes formed in bottom surfaces of the object accommodating portions, sucking and fixing the objects on the bottom surfaces of the object accommodating portions of the object accommodating unit through the suction holes, and electrically inspecting the objects.

19 Claims, 4 Drawing Sheets

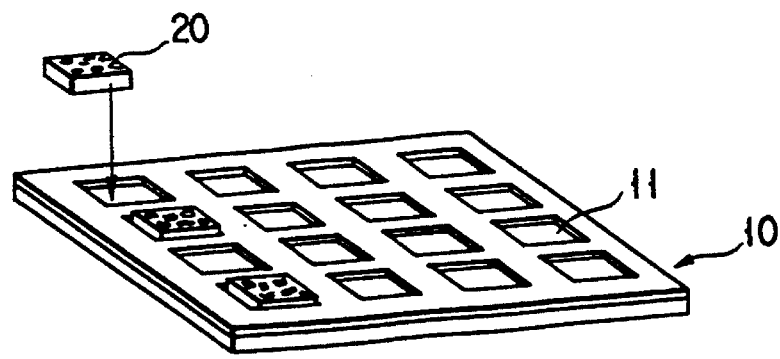
F I G. 3
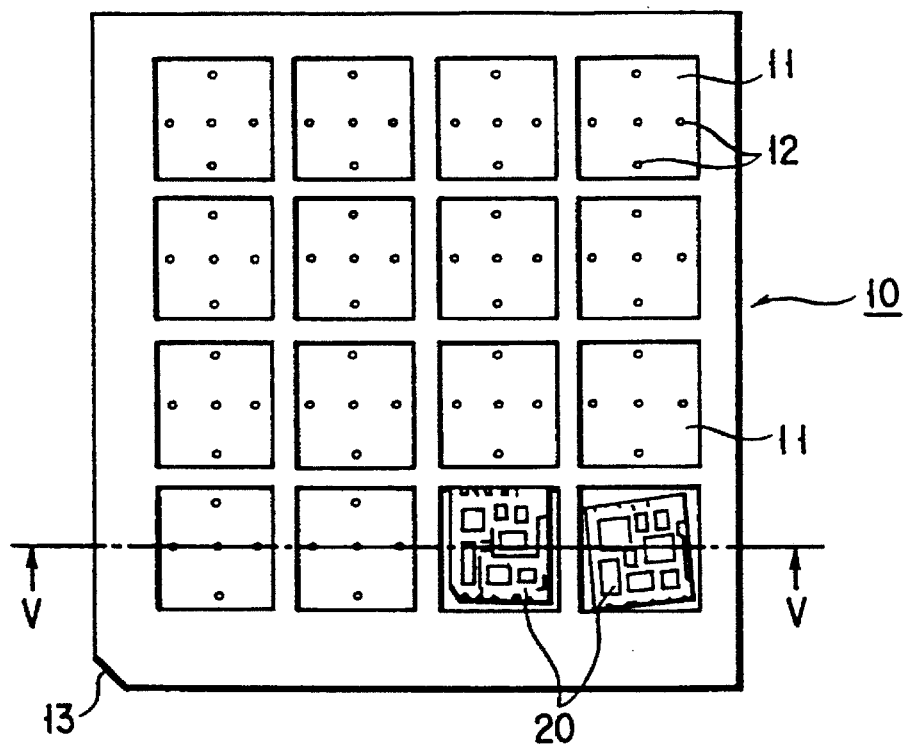
F I G. 4

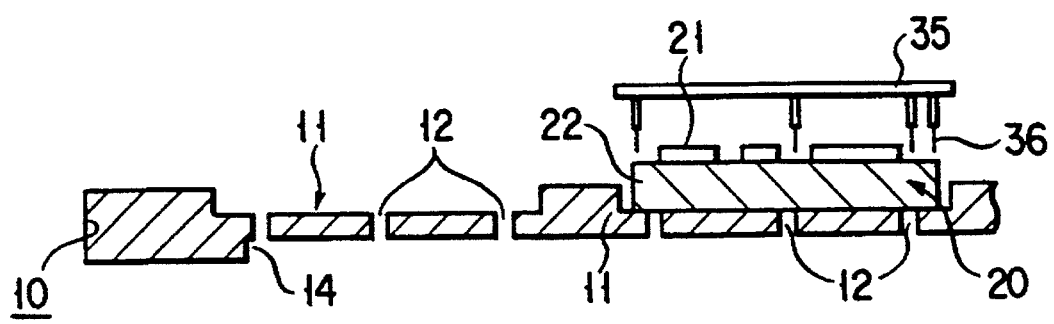
F I G. 5
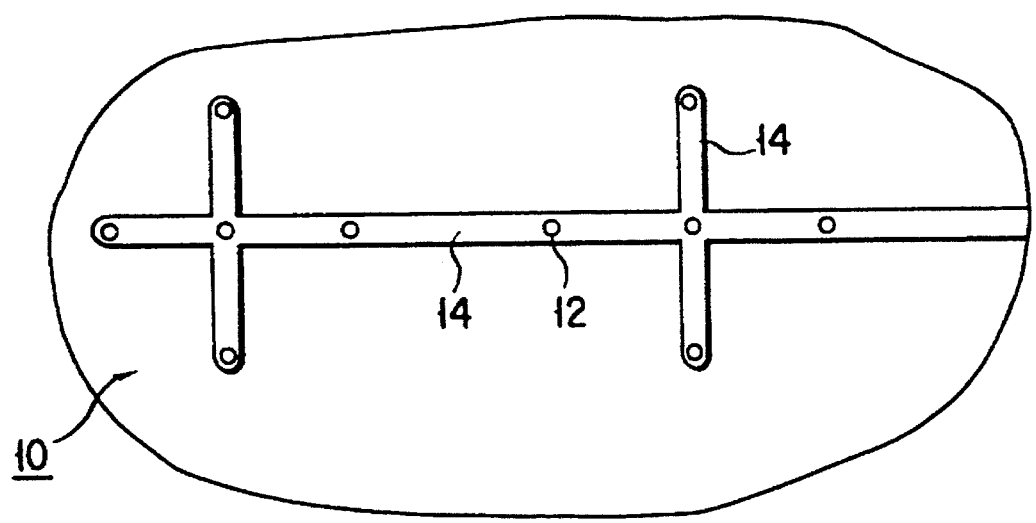
F I G. 6

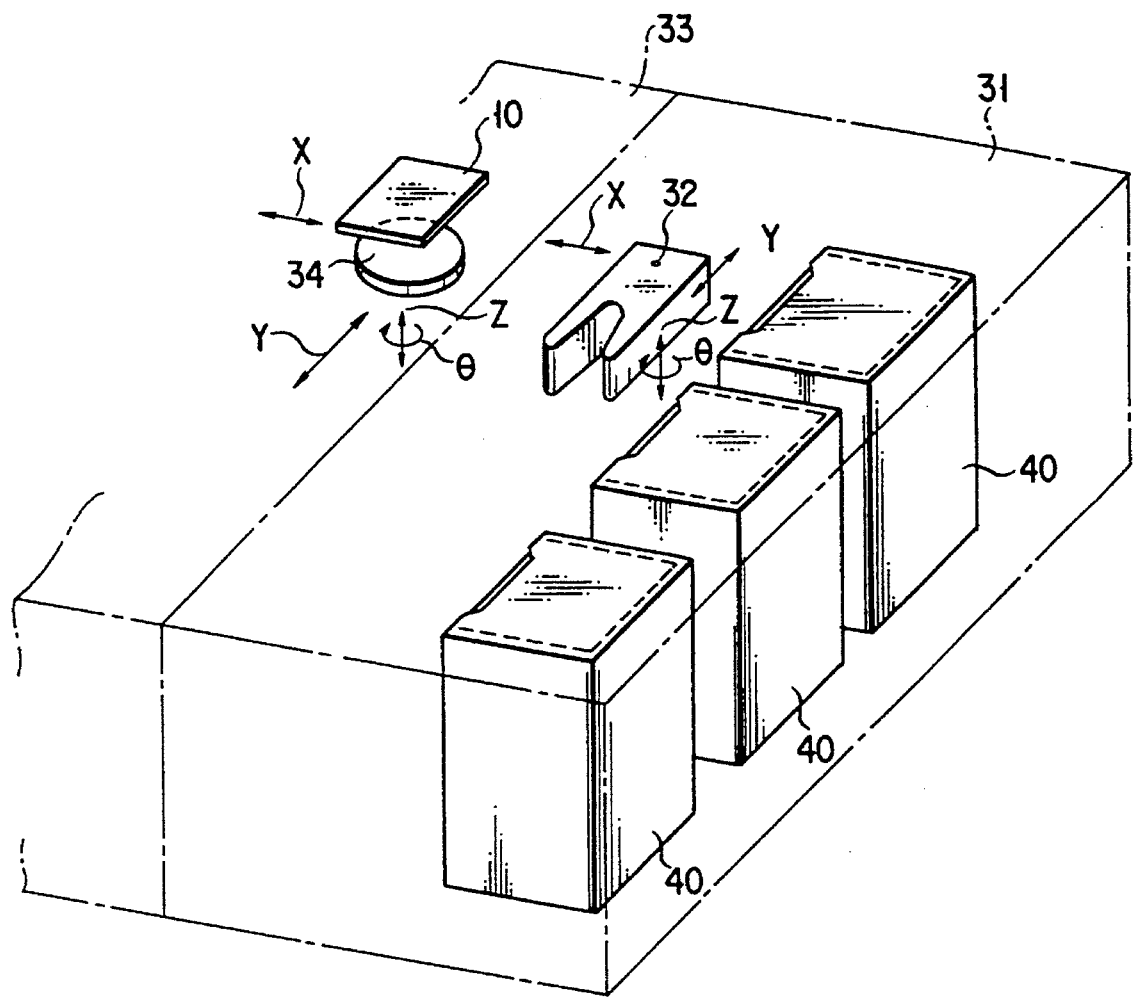
F I G. 7

PROBE APPARATUS AND METHOD FOR INSPECTING OBJECT USING THE PROBE APPARATUS

This is a continuation of application Ser. No. 08/260,012 filed on Jun. 15, 1994, now abandoned.

BACKGROUND OF THE INVENTION

1. Field of the Invention

This invention relates to a probe apparatus and a method for inspecting an object with the use of the probe apparatus.

2. Description of the Related Art

In general, semiconductor devices are assembled after various inspecting processes, and thereafter the basic operational characteristics of the devices are inspected through a burn-in system such as dynamic burn-in. Only good semiconductor devices which passed the electrical inspection are put on the market, and are mounted on printed circuit boards and used for various purposes.

In a general conventional method for mounting a semiconductor device onto a printed circuit board, IC packages are mounted on a printed circuit board, which are obtained by mounting IC chips such as LSIs on lead frames and then packaging the resultants with a resin or a ceramics. Recently, however, a bare chip mounting method has attracted a great deal of public attention. In a system using the method, bare IC chips which are not yet packaged are directly mounted on a board having wiring layers laminated, by the use of a TAB method or a flip chip mounting method, etc.

The bare chip mounting method enables high density mounting and miniaturization since it mounts chips without packages, and also enables high speed calculation as a result of a reduction in wire length. For example, such a bare chip mounting method is spreading, for example of, as a Multi-Chip Module (hereinafter briefly called "MCM").

By virtue of the above advantage, MCMs are considered to be applied from now on to workstations such as CADs, etc., and to more and more spread rapidly. Since the MCM is a system which comprises a multiplicity of IC chips (bare chips) having various functions and provides a predetermined calculating function, electrical inspections are necessary to inspect whether each bare chip can effect its function and also whether the system, a combination of bare chips, can effect the predetermined calculating function.

However, since the MCM itself is a new product, bare chips are not being individually sold, and there is no inspection system for inspecting each bare chip. Therefore, at present, a special inspection system is used to electrically inspect bare chips individually. Good bare chips selected as a result of the inspection are mounted on a board to form an MCM, thereby packaging the MCM to provide a finished MCM product. The finished MCM product is inspected by the use of another inspection system.

In the above-described conventional inspecting system for inspecting finished MCM products, however, it is necessary to transfer the finished MCM products one by one into the inspecting section of the inspection system to electrically inspect them, and thereafter to take them out of the inspecting section. As a result, a great amount of time is necessary to inspect a large number of MCMs. This cannot meet the increasing demand for the inspection of MCMs, which is expected in the near future in accordance with widely spread MCMs.

Further, since in the case of the conventional inspecting system, only a finished product is electrically inspected, it can be deemed defective due to a single defective bare chip incorporated therein. Thus, even good bare chips contained in the finished product deemed defective are casted away together with defective bare chips.

SUMMARY OF THE INVENTION

The present invention has been developed to solve the above-described problems, and aims to provide a probe apparatus capable of successively and smoothly performing electrical inspection of semifinished products such as MCMs having bare chips mounted thereon, and an inspecting method employed in the probe apparatus.

To attain the aim, there is provided a probe apparatus comprising a plurality of object accommodating members each having a plurality of object accommodating portions for accommodating objects to be inspected; a cassette for containing the object accommodating members; a table on which each of the object accommodating members is to be placed, the table being movable in X, Y and Z directions and rotatable in a θ direction; transfer means for transferring each of the object accommodating members between the table and the cassette; and a detecting section having a plurality of probe needles, for electrically inspecting objects one by one which are accommodated in one of the object accommodating members placed on the table, wherein each of the object accommodating portions has suction holes formed in an inner bottom surface thereof and used to suck the object.

Further, there is provided a method for inspecting objects, comprising the steps of: transferring from a cassette onto a table located in a detecting section, an object accommodating member which is contained in the cassette with a plurality of objects mounted thereon, and has object accommodating portions and suction holes formed in bottom surfaces of the object accommodating portions; sucking and fixing the objects on the bottom surfaces of the object accommodating portions of the object accommodating unit through the suction holes; and electrically inspecting the objects.

In the probe apparatus according to the invention, at the time of electrically inspecting a plurality of objects, the objects can be received separately in the object accommodating portions of each object accommodating unit, and be simultaneously transferred onto the table in the inspecting section, together with the object accommodating member. When the objects are placed on the table, they can be tightly fixed on the bottom surfaces of the object accommodating portions through the suction holes. A semifinished product not yet packaged which has a board and a plurality of bare chips mounted thereon can be used as the object. A plurality of such semifinished objects can be simultaneously supplied and electrically inspected. Thus, a multiplicity of objects can be individually and successively inspected in the inspecting section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a perspective view, showing an example of the object accommodating unit;

FIG. 4 is a plan view of the object accommodating unit;

FIG. 5 is a cross sectional view, taken along line V—V in FIG. 4;

FIG. 6 is a plan view, showing part of the reverse surface of the object accommodating unit of FIG. 3; and FIG. 7 is a perspective view, showing a probe apparatus according to another embodiment of the invention.

DETAILED DESCRIPTION OF THE PREFERRED EMBODIMENTS

The embodiments of the invention will be explained with reference to the accompanying drawings.

Figure 1:
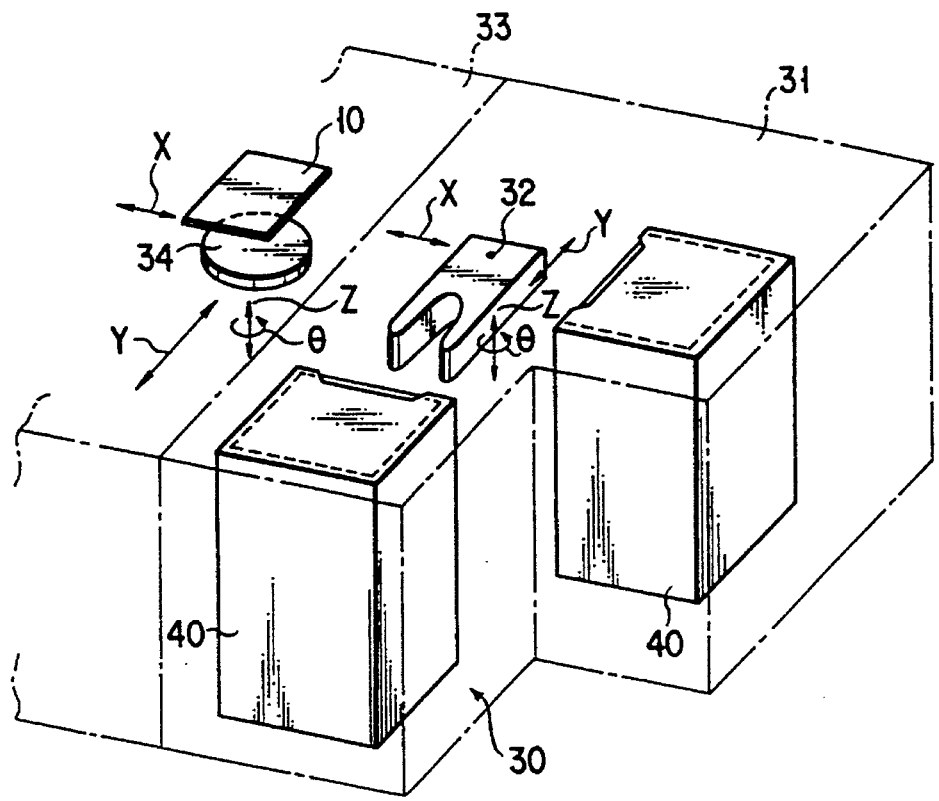
FIG. 1 is a perspective view, showing a probe apparatus according to an embodiment of the invention.

FIG. 1 is a perspective view, showing a probe apparatus according to an embodiment of the invention. In FIG. 1, reference numeral 30 denotes a probe apparatus. The probe apparatus 30 can automatically and successively perform electrical inspection of objects 20 to be inspected (such as MCMs which have not yet been packaged) with the use; for example, of a receiving tray 10 as an object accommodating unit. A plurality of trays 10 are contained in a cassette 40 and arranged in several stages. The probe apparatus 30 successively performs electrical inspection of each of the objects 20 received in the trays 10 in the cassette 40 which is transported in the main body of the probe apparatus 30 (referring to U.S. Pat. No. 5,172,053).

The main body of the apparatus 30 has a storage section 31 for storing the cassette 40 with the receiving trays 10 arranged in several stages, a transfer unit 32 consisting of a vacuum robot arm, etc., for sucking and transferring the receiving trays 10 from the cassette 40 one by one, and an inspecting section 33 for performing electrical inspection of the objects 20 placed on the receiving trays 10 transferred by the transfer unit 32, the internal temperature of which section is changeable within the range of −30°–150° C. As is shown in FIG. 1, the transfer unit 32 can move in X and Y directions, rotate in a θ direction, and reciprocate between the storage section 31 and the inspecting section 33 adjacent thereto to transfer the receiving tray 10 therebetween.

The inspecting section 33 contains a table 34 which can move the tray 10, having transferred by the transfer unit 32 from the cassette 40, in X, Y and z directions, and rotate the same in a θ direction, and a detection unit (not shown) for detecting the input/output electrodes and the internal inspection pads of each object 20 accommodated in the tray 10 on the table 34. The table 34 has a plurality of suction portions (numeral 12 in FIG. 4) which communicate with a vacuum exhausting unit. Each suction portion has a portion corresponding to an air passage 14 (FIG. 6) in the tray 10 and the other portion, and sucks the tray 10 to fix the objects 20 in the receiving portions 11 of each tray 10 and the tray 10 itself on the table 34.

The probe apparatus 30 has a control unit (not shown) which is responsive to a detection signal from the detecting unit for adjusting the position of the table 34 and hence the positions of the objects 20 relative to the probe needles 36 of a probe-card 35 (FIG. 5). The control unit has a register section for registering the pattern of the input/output electrodes and inner inspection pads of each object 20; a comparator section for comparing the registered pattern with the actual pattern of the input/output electrodes and the inspection pads of each object 20 which is based on the detection signal, thereby obtaining the amount of positional misalignment; and a judging section for judging based on the comparison result whether or not the positioning is performed correctly. Based on the judging result, the table 34 is adjusted such that the objects 20 can be accurately aligned with the probe needles 36. The registering section also prestores the position of the receiving tray 10 in which each object 20 is received, and the order of inspection.

Figure 2:
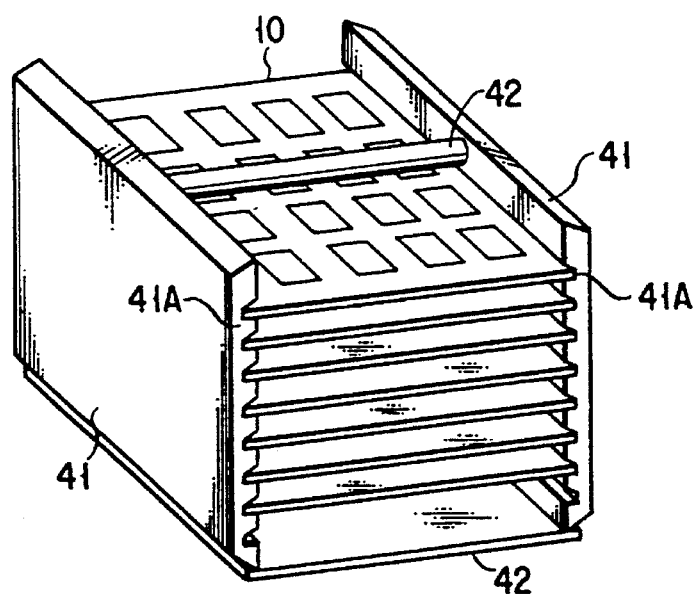
FIG. 2 is a perspective view, showing a cassette installed in the apparatus of FIG. 1 and containing an object accommodating unit in which objects to be inspected are accommodated.

As is shown in FIG. 2, the cassette 40 for transferring the receiving tray 10 has a pair of side plates 41 having grooves 41A formed therein to horizontally hold the both opposite ends of each receiving tray 10; and coupling members 42, such as a plate and/or a bar, which connect upper portions of the side plates 41 to each other and lower portions thereof to each other. At the time of inspection, the cassette 40 containing the receiving trays 10 with the objects 20 is automatically transferred into and out of the storage section 31 of the probe apparatus 30.

As is shown in FIGS. 3 and 4, in this embodiment, the receiving tray 10 is disposed to receive a plurality of objects 20, and is formed of a rectangular plate made of e.g. a glass ceramic. The objects 20 are automatically and successively subjected to electrical inspection in a state where they are received in each tray 10 placed on the table in the inspecting section, which will be hereinafter referred to in more detail.

Each tray 10 has a plurality of (for example, 16) receiving portions 11 arranged in the form of a matrix for receiving the objects 20 individually; and suction holes 12 formed in the bottom of each receiving portion 11 for sucking and fixing a corresponding object. An orientation flat 13 is formed at one corner of the rectangular tray 10, and used to position the tray 10 in a predetermined direction when the objects in the tray 10 are subjected to electrical inspection.

As is shown in FIG. 5, each receiving portion 11 is a rectangular concave portion in which a corresponding rectangular object can be fitted. The bottom surface of the receiving portion 11 is mirror finished so that the lower surface of the object 20 can tightly contact the bottom. Further, as is shown in FIG. 6, a cross-shaped groove is formed in the reverse surface of each receiving portion 11, and serves as an air passage 14. The suction holes 12 are formed in five portions including each end portions and an intersecting portion of the air passage 14. At the time of fixing the object, air is sucked through the suction portions 12, thereby tightly holding the object 20 on the bottom of the receiving portion 11.

The object 20 received in the tray 10 consists, for example, of an MCM with bare chips 21 mounted thereon and not yet packaged, separate IC chips (bare chips), a tape carrier package, or a bare substrate on which bare chips are not mounted yet. The unpackaged MCM consists of a plurality of bare chips and a layered board 22 having the bare chips mounted thereon, as is shown in FIGS. 4 and 5.

The operation of the probe apparatus of the invention will be explained in detail, which is performed when it electrically inspects a semifinished product (an example of the object 20) consisting of a layered board 22 and a plurality of bare chips 21 mounted thereon.

First, as is shown in FIG. 3, the objects 20 are successively transferred into the receiving portions 11 of each receiving tray 10, and then the receiving trays 10 are successively transferred into the cassette 40. The cassette 40 is moved into the storage section 31 of the probe apparatus 30 by means of the transfer unit. Subsequently, the transfer unit 32 is driven to take one receiving tray 10 out of the cassette 40 and move it onto the table 34 in the inspecting section 33.

After the receiving tray 10 is moved to the table 34, a vacuum exhaustion unit (not shown) is driven to fix the tray 10 on the table 34 by through the suction portions, and to fix the objects 20 on the respective bottom surfaces of the receiving portions 11 through the air passage 14 and the suction holes 12 of the tray 10. Since the bottom surfaces are mirror finished, the objects 20 can be tightly fixed on the bottom surfaces.

The detection unit successively detects respective predetermined portions of the objects 20 in the tray 10, and successively transmits detection signals to the control unit. In the control unit, the prestored arrangement patterns of all the objects 20 are successively read out in the order of detection, and the detected arrangement pattern of each object 20 is compared with the prestored pattern of the same. The comparison results are successively transmitted to the judging section, where the amount of the misalignment of each object 20 is determined. Thereafter, the table 34 is displaced in the X and Y directions and also rotated in the θ direction in accordance with each determination result, to correct the misalignment of each object 20 and accurately position the object relative to the probe needles 36. Then, the table 34 is displaced in the Z direction to bring the probe needles 36 into contact the input/output electrodes and the inspection pads of each object 20, thereby to electrically inspect the object.

Thus, the probe apparatus 30 successively inspects all the objects 20 in the receiving tray 10 by displacing the table 34 in the order of inspection registered, and is stopped. The apparatus 30 can electrically inspect not only a semifinished MCM through its input/output electrodes, but also the bare chips 21 through its internal inspection pads.

After finishing the inspection of all the objects 20 received in one tray 10, the transfer unit 32 is driven to return the tray 10 into the cassette 40 and takes the next tray 10 therefrom to inspect other objects 20 received in this tray. After finishing the inspection of all the objects received in all the trays 10 in the cassette 40, the cassette 40 is transferred to the outside of the apparatus 30 to forward the cassette 40 to the next process. At the same time, the next cassette 40, which is already positioned in the storage section 31 and on standby, is subjected to electrical inspection similar to the above, and another cassette 40 is automatically transferred into the storage section 31 to be made on standby.

As explained above, in the invention, at the time of electrically inspecting the objects 20 by the probe apparatus 30, 16 objects are received in the receiving portions 11 of each receiving tray 10, respectively, then the cassette 40 with a plurality of trays 10 is transferred into the storage section 31 of the probe apparatus 30, each tray 10 is moved from the cassette 40 to the table 34 in the inspecting section 33 by means of the transfer unit 32, and the objects 20 are tightly fixed on the bottom surfaces of the receiving portions 11 by the use of the sucking force exerting thereon through the suction holes 12 of the tray 10. This being so, the objects are free from displacement, and hence all the objects can be automatically and successively brought into contact with the probe needles 36. Thus, the electrical inspection of the objects 20 can be quickly and smoothly performed.

Moreover, as is shown in FIG. 7, a greater number of objects can be automatically and smoothly inspected by aligning a plurality of cassettes 40, and making the transfer unit 32 movable, with the use of a ball screw, in a direction parallel to the direction in which the cassettes 40 are aligned.

In summary, in the invention, not only a semifinished MCM having bare chips 21 mounted thereon but also each bare chip 21 can be electrically inspected. Therefore, if the whole MCM is judged defective due to a defective bare chip mounted thereon, the defective bare chip can be detected, and hence the defective MCM be repaired only by replacing the defective bare chip with a new good one. As a result, the yield of product can be remarkably increased.

Although in the embodiment, a semifinished MCM is electrically inspected, an IC chip itself (a bare chip), a tape carrier package, and a bare substrate on which bare chips are not mounted yet, etc. can be done so, too. In addition, the invention can be applied also to a combination of bare chips and IC packages.

As explained above, the probe apparatus of the invention can perform successive and smooth electrical inspection of bare chips themselves and semifinished MCMs each of which has bare chips mounted thereon and not yet packaged, thereby enhancing the yield of product. Further, the invention can be used also as a probe apparatus for inspecting LCD boards.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A probe apparatus comprising:

a plurality of trays each having a plurality of receiving portions for accommodating bare chips to be inspected, the bare chips pected having been cut from a wafer;

a cassette for containing the trays;

a table on which each of the trays is to be placed, the table being movable in X, Y, and Z directions and rotatable in a θ direction;

transfer means for transferring each of the trays between the table and the cassette; and a detecting section having a plurality of probe needles, for electrically inspecting the bare chips one by one which are accommodated in one of the trays placed on the table, wherein each of the receiving portions has suction holes formed in an inner bottom surface thereof and used to suck one of the bare chips, and also has a depth of less than a thickness of a bare chip.

2. The probe apparatus according to claim 1, wherein the transfer means is movable in X, Y and Z directions and rotatable in a θ direction.

3. The probe apparatus according to claim 1, wherein each of the trays has a groove formed in a region including the suction holes and in an outer bottom surface thereof opposite to the inner bottom surfaces of the receiving portions.

4. The probe apparatus according to claim 1, wherein the table has suction means for tightly fixing each bare chips on the inner bottom surface of the receiving portion.

5. The probe apparatus according to claim 1, wherein the inner bottom surface of the receiving portion is mirror finished.

6. The probe apparatus according to claim 1, further comprising a storage section for storing the cassette which contains the trays with the bare chips to be inspected.

7. An apparatus for probing a plurality of semifinished multi-chip modules having a plurality of bare chips mounted thereon, comprising:

a plurality of trays defining receptacles for positioning the multi-chip modules therein;

a cassette for housing the trays;

a table for supporting one of the trays thereon, the table being movable in X, Y, and Z directions and rotatable in a θ direction;

transfer means for transferring the trays between the table and the cassette; and inspection means having a plurality of probe needles for electrically inspecting the multi-chip modules and the bare chips mounted thereon when the tray is placed on the table, wherein each of the receptacles defines a plurality of suction holes for stable retention of the multi-chip module in the receptacle.

8. A method of inspecting unpackaged semiconductor devices having bare chips mounted thereon, the bare chips having been cut from a wafer, comprising the steps of:

transferring from a cassette onto a table located in a detecting section a tray which is contained in the cassette with a plurality of the devices mounted thereon, and which has receiving portions and suction holes formed in bottom surfaces of the receiving portions;

sucking and fixing the devices on the bottom surfaces of the receiving portions of the tray through the suction holes;

detecting the position of each of the devices placed on the tray;

moving the table in accordance with a signal indicative of the detected position, thereby adjusting the position of the device relative to probe needles;

electrically inspecting the devices and the bare chips mounted thereon; and after the inspection of all the devices and the bare chips mounted thereon, transferring the tray from the table to the cassette by means of transfer means, and transferring another tray from the cassette onto the table by means of the transfer means to electrically inspect another set of unpackaged semiconductor devices, and bare chips mounted thereon, placed on the latter tray.

9. A probe apparatus comprising:

a plurality of trays each having a plurality of receiving portions for accommodating semifinished semiconductor devices to be inspected, each device having a plurality of bare chips mounted thereon;

a cassette for containing the trays;

a table on which each of the trays is to be placed, the table being movable in X, Y, and Z directions and rotatable in a θ direction;

transfer means for transferring each of the trays between the table and the cassette; and a detecting section having a plurality of probe needles, for electrically inspecting the semifinished semiconductor devices one by one which are accommodated in one of the trays placed on the table and for electrically inspecting the bare chips mounted on each of the semifinished semiconductor devices individually, wherein each of the receiving portions has suction holes formed in an inner bottom surface thereof and used to suck one of the semifinished semiconductor devices.

10. A probe apparatus comprising:

a plurality of trays each having a plurality of receptacles for accommodating bare chips to be inspected, the bare chips to be inspected already cut from a wafer;

a plurality of cassettes for containing the trays arranged in parallel;

a table on which each of the trays is to be placed, the table being moveable in X, Y, and Z directions and rotatable in a θ direction;

transfer means for transferring each of the trays between the table and the cassette, the transfer means being movable in X, Y, and Z directions and rotatable in a θ direction; and a detecting section having a plurality of probe needles, for electrically inspecting the bare chips one by one which are accommodated in one of the trays placed on the table, wherein each of the receptacles has suction holes formed in an inner bottom surface thereof and used to suck one of the bare chips, and also has a depth less than a thickness of a bare chip.

11. The probe apparatus according to claim 10, wherein each of the trays has a groove formed in a region including the suction holes and in an outer bottom surface thereof opposite to the inner bottom surfaces of the receptacles.

12. The probe apparatus according to claim 10, wherein the table has suction means for tightly fixing each bare chip on the inner bottom surface of the receptacles.

13. The probe apparatus according to claim 10, wherein the inner bottom surface of the receptacle is mirror finished.

14. The probe apparatus according to claim 10, further comprising a storage section for storing the cassette which contains the trays with the bare chip to be inspected.

15. An apparatus for probing a plurality of semifinished multi-chip modules having a plurality of bare chips mounted thereon, comprising:

a plurality of trays defining receptacles for positioning the multi-chip modules therein;

a plurality of cassettes for housing the trays arranged in parallel;

a table for supporting one of the trays thereon, the table being movable in X, Y, and Z directions and rotatable in a θ direction;

transfer means for transferring the trays between the table and the cassette, the transfer means being movable in X, Y, and Z directions and rotatable in a θ direction; and inspection means having a plurality of probe needles for electrically inspecting the multi-chip modules and the bare chips mounted thereon when the tray is placed on the table, wherein each of the receptacles defines a plurality of suction holes for stable retention of the multi-chip modules in the receptacle.

16. The probe apparatus according to claim 15, wherein each of the trays has a groove formed in a region including the suction holes.

17. The probe apparatus according to claim 15, wherein the table has suction means for tightly fixing each multi-chip module.

18. The probe apparatus according to claim 15, wherein a surface in contact with the multi-chip module in the trays is mirror finished.

19. The probe apparatus according to claim 15, further comprising a storage section for storing the cassette which contains the trays with the multi-chip modules to be inspected.

* * * * *